US005469321A

United States Patent [19]

Stupak, Jr.

[11] Patent Number: 5,469,321

[45] Date of Patent: Nov. 21, 1995

[54] MAGNETIZING DEVICE HAVING VARIABLE CHARGE STORAGE NETWORK AND VOLTAGE CONTROL

[76] Inventor: Joseph J. Stupak, Jr., 7102 SW. 10th Ave., Portland, Oreg. 97219

[21] Appl. No.: 975,790

[22] Filed: Nov. 13, 1992

[51] Int. Cl.$^6$ .......... G01R 11/32

[52] U.S. Cl. .......... 361/156; 361/150; 307/108

[58] Field of Search .......... 361/156, 150, 361/151; 307/108, 107, 10.1, 106; 363/63, 65, 71, 96, 135, 139, 131, 133; 318/139, 138

[56] References Cited

U.S. PATENT DOCUMENTS

| | | | |
|---|---|---|---|
| 3,300,688 | 1/1967 | Callihan | 317/123 |
| 3,341,746 | 9/1967 | Baker et al. | 317/123 |
| 3,346,778 | 10/1967 | Schroeder et al. | 317/123 |
| 3,390,310 | 6/1968 | Peterson | 361/141 |
| 3,535,597 | 9/1970 | Kendrick | 317/155.5 |
| 3,878,449 | 4/1975 | Wilhelmi et al. | 307/106 |
| 4,061,960 | 12/1977 | Lloyd | 323/9 |
| 4,148,091 | 4/1979 | Hansen et al. | 361/156 |
| 4,684,820 | 8/1987 | Valencia | 307/106 |
| 4,754,220 | 6/1988 | Shimizu et al. | 324/208 |
| 4,884,028 | 11/1989 | Kozlov et al. | 324/213 |
| 5,032,785 | 7/1991 | Mathis et al. | 324/107 |

*Primary Examiner*—Steven L. Stephan
*Assistant Examiner*—Aditya Krishnan
*Attorney, Agent, or Firm*—Chernoff Vilhuer et al.

[57] ABSTRACT

A magnetizing device for generating a high current magnetizing pulse includes a plurality of charge storage devices and a source of current connected by selector switches for charging selected ones of the charge storage devices to a predetermined voltage level. When the selected charge storage devices are charged the selector switches are opened and the selected charge storage devices are discharged through diode circuits coupled to a common SCR. In this way the current pulse does not flow through the selector switches. A peak current meter using a current transformer provides a display of the peak current of the magnetizing pulse.

16 Claims, 2 Drawing Sheets

MAGNETIZING DEVICE HAVING VARIABLE CHARGE STORAGE NETWORK AND VOLTAGE CONTROL

BACKGROUND OF THE PRESENT INVENTION

The following invention relates to a magnetizing device for producing permanent magnetic fields in magnet material and more particularly to a magnetizer in which the intensity and duration of a magnetizing pulse may be controlled by regulating the amount of stored charge used to create the pulse and the voltage level of the devices used to store the charge.

Permanent magnets of the type used in electric motors, linear actuators and the like are created by magnetizing magnetically hard permeable materials. This type of magnetization is usually accomplished by placing the material within a high intensity magnetic field which is created by passing a very high electric current pulse through a coil or coil-pole structure usually called a magnetic fixture. The current pulse is created by the sudden release of charge stored in charge storage devices such as banks of capacitors. The high current pulse resulting from the sudden release of the charge passes through the windings of the magnetic fixture and causes a brief but very strong magnetic field which, in turn, causes the magnetic domains within the magnetically permeable material to align in the required pattern. This alignment is achieved within the material in such a brief period of time (less than a few millionths of a second) that it may be considered instantaneous. Once the magnetic field of the fixture collapses, the material remains permanently magnetized.

Magnetizing fixtures and coils have considerable inductance which tends to slow the rate of current build-up after the pulse has begun. In addition, eddy currents may be present in the pole materials of the fixture, in the windings, or in the magnet itself which impede the rate in increase of the magnetic field. The magnetizer must be able to supply a high rate of energy transfer for a period of time long enough to overcome these retarding effects, but the pulse must not be too long because the current is very high, on the order of thousands of amps. If this high current were to be maintained for more than a very brief time, the fixture would overheat or perhaps even vaporize. It is critical, therefore, in such devices to precisely control both the intensity and the duration of the current pulse that creates the magnetizing field.

Magnetizers of the sort discussed above must magnetize various materials of differing sizes. This being the case it is necessary to precisely define the parameters of the current pulse that will create the necessary high intensity magnetic field without overstressing the magnetizing fixture.

This current pulse is usually created by electrical charges stored in banks of capacitors where the peak voltage is often set by adjusting the output of a transformer that is used in the rectifier to convert line AC voltage to DC. This DC voltage is used to charge the capacitors. The problem with this circuit is that its charging rate is high at first but drops off as the capacitor banks charge up, resulting in an increased period of time required to charge. This is undesirable because it may slow production.

When the capacitor banks become charged they are discharged through a fast-acting switch. In the past such devices often used a mercury-filled vacuum tube. This type of switch has a high and a variable voltage drop depending on its temperature and age and requires high voltage to fire. The switch may also present a health hazard in case of breakage due to the mercury and its vapor. Such switches are, therefore, highly unsatisfactory for this type of application.

Due to the widely varying types of motors and magnetic materials available today there is a need for magnetizers which can deal with the varied requirements for magnetic materials. For example, a particular magnetizer may have either too small or too large a capacitance. Regardless of the voltage the current pulse needed to create the magnetic field may thus be incorrect for that particular application. There is, therefore, a need for a magnetizer which has both a variable capacitance as well as a variable voltage in order to precisely define the intensity and duration of the high current magnetizing pulse.

It is also desirable to have a magnetizer which includes means of measuring the peak output current, If the magnetizing fixture begins to overheat due to a high cycle rate of usage, for example, or to short circuit within the fixture itself, the peak current will change. A change in peak current may indicate poor magnetization or progressive failure which may become catastrophic if left uncorrected. The current pulses which create the magnetizing fields, however, are of very short duration and very high amplitude, and are, therefore, difficult to monitor.

SUMMARY OF THE PRESENT INVENTION

In one aspect of the invention an electromotive force machine for generating high intensity magnetic fields includes a plurality of charge storage devices which are charged by a source of electrical current. A set of selector switches connects selected ones of the charge storage devices to the source of electrical current to control the amount of charge actually stored. The charge storage devices are coupled to a magnetizing coil fixture through a discharge switch connected in parallel with the set of selector switches. The selector switches are open when the charge storage devices are discharged. In this way the current pulse flows only through the discharge switch and not through the selector switches that were used to charge the storage devices.

The machine may further include a voltage controller that is coupled to the charge storage devices for regulating the voltage to which the devices are charged. The charge storage devices are typically banks of capacitors and by selecting groups of the capacitor banks, the capacitance is chosen. A voltage comparator is connected in parallel with the output of a constant current source so that when the required voltage is reached on a selected bank of capacitors, the constant current source is turned off. When the voltage level to which the selected capacitors is charged is regulated as well as the capacitance, the user precisely defines both the intensity and duration of the resulting high current pulse.

The discharge switch is typically a silicon control rectifier (SCR) or other latching solid state switch capable of handling the high currents needed to create the magnetizing field. Each bank of capacitors has its own output line coupled through a protective diode to the silicon control rectifier switch. This line is in parallel with the input line from the constant current source that is used to charge selected banks of capacitors through the set of selector switches. In this way the output discharge current does not flow through the selector switches but flows only through a diode circuit to the SCR.

In another aspect of the invention a current transformer monitors the current in the magnetizing coil circuit and provides a signal to a display network which generates a signal indicative of the peak amount of the current. This signal has a duration substantially longer than the duration of the high current pulse and causes a display meter to register the peak current value until the circuit is reset by a reset switch.

This display network includes a peak hold circuit whose time constant is very long compared to the duration of the high current pulse. This signal is held in the form of charge on a storage capacitor which may be coupled to ground through an electronic reset switch.

It is a principal object of this invention to provide an electromotive force machine such as a magnetizer that includes the capability for precisely defining the intensity and duration of a high current magnetizing pulse.

A further object of this invention is to provide a variable capacitance magnetizer in which the input charging circuit for charge storage devices is isolated from the output lines of the charge storage devices.

Yet a further object of this invention is to provide a variable capacitance, controllable voltage magnetizer for magnetizing permanent magnet materials.

A still further object of this invention is to provide a magnetizing machine for permanent magnet materials which includes a peak current display for monitoring the intensity of the magnetizing current pulse.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
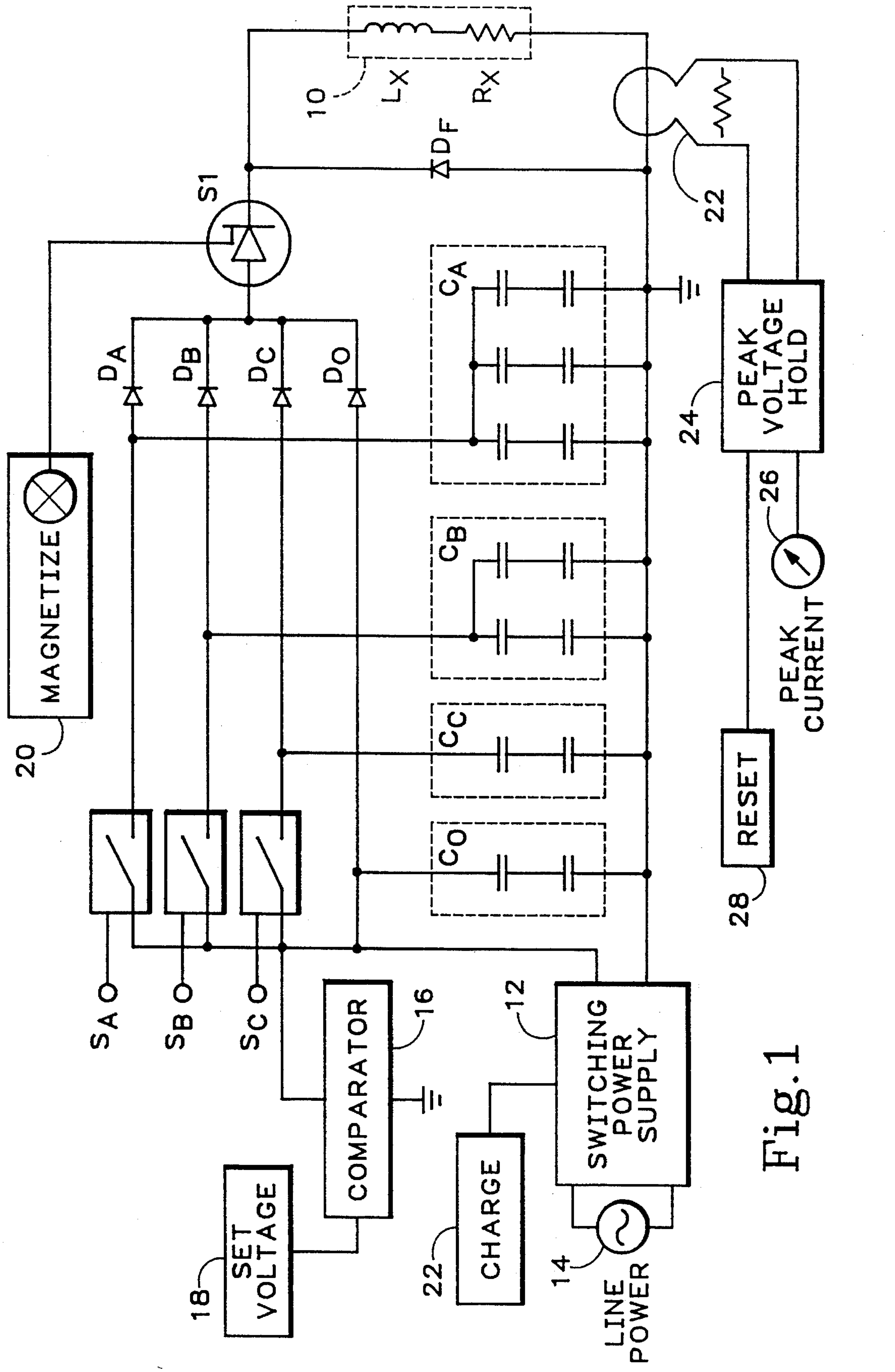
FIG. 1 is a schematic diagram of a magnetizing machine illustrating the present invention.

A magnetizer for creating permanent magnet materials is shown in the schematic diagram of FIG. 1. The magnetizer includes a magnetizing fixture 10 which includes a coil $L_x$ and a resistor $R_x$. $L_x$ and $R_x$ represent the inherent inductance and resistance associated with the magnetizing fixture. The details of the magnetizing fixture 10 are unimportant for the purposes of the invention, and thus any well known configuration of such fixtures may be used. A flyback diode $D_F$ is connected across the fixture 10 to prevent the buildup of excessive voltage across the fixture after the magnetizing pulse is turned off.

The charge that is used to create a high intensity current pulse of relatively short duration is stored in banks of capacitors labeled $C_O$, $C_c$, $C_B$, and $C_A$. These banks of capacitors are selectable by engaging switches $S_A$, $S_B$, or $S_C$. Capacitor bank $C_O$ is a fixed bank of capacitors and is always charged. The overall capacitance, however, is selected by selecting one of the switches $S_A$, $S_B$, or $S_C$. When one of the aforementioned switches is closed, the selected bank of capacitors is connected to a constant current source 12 which is coupled to a line power source 14. The constant current source 12 includes a switching power supply that converts line AC to DC. The DC current then charges the selected bank of capacitors through the appropriate selector switch $S_C$, $S_B$, or $S_A$.

A voltage comparator 16 monitors the voltage level on the selected capacitor bank and turns off the power supply 12 when a preselected voltage has been reached as established by a "set voltage" control 18. Thus the combination of the selector switches $S_A$, $S_B$, and $S_C$ and the set voltage control 18 regulate both the amount of capacitance and the voltage level to which the capacitor banks are charged. These two values uniquely determine both the intensity (amplitude) and the duration of the resulting high current pulse.

Connected in parallel with the selector switches $S_A$, $S_B$, and $S_C$ are output lines coupling the banks of capacitors $C_o$, $C_A$, $C_B$, and $C_C$ to output diodes $D_o$, $D_A$, $D_B$, and $D_C$ respectively.

Each of the diodes, which serve as protective diodes for their associated capacitor banks and switches, have outputs coupled to a common node which forms the input to SCR $S_1$. The SCR is fired by a firing control 20 operated by a switch or the like. The advantage to using a single SCR is that the timing of the pulse will be the same regardless of the capacitor bank that is selected. An individual SCR for each capacitor bank could be used, however, differences in tolerances that may be small for most applications can have a profound effect on the timing of the high current pulse delivered through the switch. Typically these pulses are of very short duration, on the order of tens of microseconds to a millisecond. As noted above, it is important that the pulse be neither too short nor too long for the material that is to be placed adjacent the magnetizing fixture 10.

In operation the operator selects the appropriate bank of capacitors by closing one of the switches $S_A$, $S_B$, or $S_C$. A charge control 22 turns on the switching power supply 12 and allows it to charge the selected bank of capacitors through the closed switch. When the voltage in the chosen capacitor banks reaches the level established by the set voltage control 18, the switching power supply is turned off and the selector switch $S_A$, $S_B$, or $S_C$ is once again opened. The user may then fire the SCR by way of the magnetize control 20. It should be noted that the high current pulse does not flow through the selector switches $S_A$, $S_B$, or $S_C$ since these are open at this time, but flows only through the appropriate diode $D_A$, $D_B$, or $D_C$ (in conjunction with $D_0$) through the SCR. Thus, the selector switches are never subjected to the high current magnetizing pulse.

The output of the magnetizing fixture 10 is coupled to a current transformer 22. The current transformer 22 is in turn connected to a peak voltage holding circuit 24 which drives a peak current meter 26. The peak voltage holding circuit 24 may be reset by a reset control 28.

Figure 2:
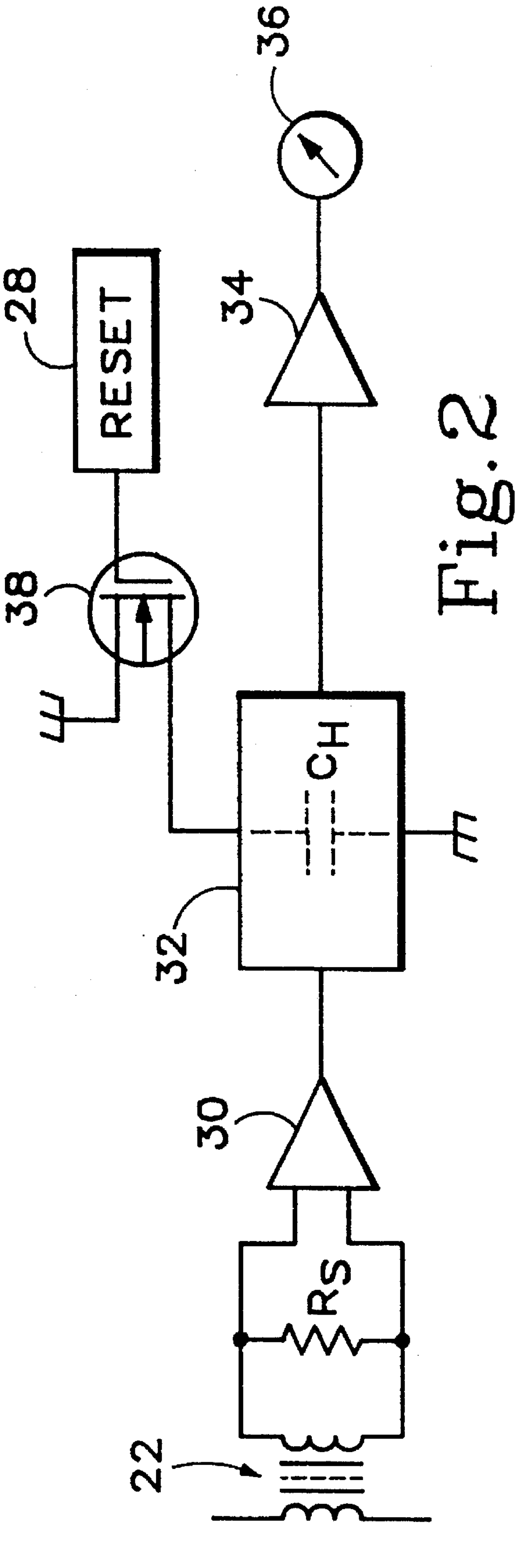
FIG. 2 is a schematic diagram of a peak current display network of the type used to indicate the peak current flowing in the coil of the magnetizing machine of FIG. 1.

The display circuit described above is shown in more detail in FIG. 2. The current transformer 22 is coupled across a resistor $R_S$ to a differential amplifier 30. The differential amplifier removes common mode noise and acts as a buffer for the current transformer. The current transformer together with resistor $R_S$ and the buffer amplifier 30 develops a signal proportional to the current flowing through the magnetic fixture 10. This current is a sharp spike which may have a duration on the order of tens to hundreds of microseconds to a millisecond. A peak hold circuit 32 is used to develop a voltage across an internal capacitor $C_H$ (shown in dashed outline) that is proportional to the peak current. Capacitor $C_H$ holds this voltage and provides it to a driving amplifier 34 which in turn drives a meter 36 which is calibrated to display the peak current in amperes. Capacitor $C_H$ will hold its voltage for a period of time much longer than the transitory duration of the peak current pulse and the meter 36 will display the peak current value until the charge accumulated on capacitor $C_H$ is grounded through a reset MOSFET switch 38. The MOSFET switch 38 is reset through reset control 28. This switch discharges capacitor $C_H$ to ground in readiness for the next magnetizing pulse.

In practice, resistors should be connected across each capacitor in the capacitor banks so as to allow the capacitors to slowly discharge if by oversight the machine is turned off without discharging the capacitor banks.

Also, an analog voltmeter may be coupled across the capacitor banks to indicate the amount of charge as a safety indicator. An analog voltmeter draws very little current but will operate even with the machine turned off. Even with the bleed resistors described above, dangerous voltage levels may exist for some time in the capacitor banks after the machine is turned off.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. An electromotive force machine for generating high intensity magnetic fields comprising:

(a) a plurality of charge storage devices;

(b) a source of electrical currents;

(c) selector switches for selectively connecting certain charge storage devices to said source of electric current;

(d) a magnetizing coil fixture; and (e) a discharge switch connected in parallel with said selector switches for coupling said selected certain charge storage devices to said magnetizing coil fixture.

2. The electromotive force machine of claim 1 further including a voltage controller coupled to said charge storage devices for regulating the amount of charge stored therein.

3. The electromotive force machine of claim 1 wherein said charge storage devices comprise multiple banks of capacitors, each said bank having a different total capacitance.

4. The electromotive force machine of claim 3 wherein said selector switches comprise a plurality of switches, each switch in said plurality selectively connectable to one of said banks of capacitors so as to selectively connect one of said banks of capacitors to said source of electric current.

5. The electromotive force machine of claim 1 wherein said discharge switch is a solid state switch.

6. The electromotive force machine of claim 1 wherein said source of electrical current is a constant current source.

7. The electromotive force machine of claim 5 wherein said solid state switch is an SCR.

8. The electromotive force machine of claim 2 wherein said voltage controller includes a variable voltage comparator coupled in parallel with said charge storage devices.

9. The electromotive force machine of claim 1 wherein each one of said plurality of said charge storage devices are coupled to said discharge switch through a protective diode.

10. A magnetizing device for producing permanent magnetic fields in magnet material comprising:

(a) a circuit for generating a high current pulse of short duration into a magnetizing coil fixture;

(b) a current transformer for sensing the amount of current through said coil fixture during said pulse; and (c) a display network for generating a signal indicative of the amount of said current, said signal having a duration substantially longer than the duration of said high current pulse.

11. The electromotive force machine of claim 10 wherein said display network includes a peak hold circuit responsive to an output of said current transformer.

12. The electromotive force machine of claim 11 wherein said peak hold circuit includes a storage capacitor and further includes a reset switch for discharging said storage capacitor.

13. The electromotive force machine of claim 10 further including a reset switch for resetting the display network after each high current pulse,

14. An electromotive force machine for generating a high current pulse for magnetizing magnetically permeable material comprising:

(a) a plurality of charge storage devices;

(b) a current source;

(c) switch means for selectively coupling charge storage devices to said current source for charging said devices to a preselected voltage; and (d) voltage monitoring means for regulating the preselected voltage on said charge storage devices.

15. The electromotive force machine of claim 14 wherein said charge storage devices are banks of capacitors and said switch means comprises a plurality of switches for selectively connecting banks of capacitors to said current source.

16. The electromotive force machine of claim 14 wherein each of said banks of capacitors includes an output line including a protective diode connected in parallel with said switch means, each of said output lines connected to a single discharge switch means for generating said high current pulse.

* * * * *

UNITED STATES PATENT AND TRADEMARK OFFICE

CERTIFICATE OF CORRECTION

PATENT NO. : 5,469,321

DATED : November 21, 1995

INVENTOR(S) : Joseph J. Stupak, Jr.

It is certified that error appears in the above-indentified patent and that said Letters Patent is hereby corrected as shown below:

In Column 2, Line 18, after current delete "," and insert --.-- .

Signed and Sealed this

Fourteenth Day of May, 1996

Attest:

BRUCE LEHMAN

*Attesting Officer*

*Commissioner of Patents and Trademarks*